US007011909B2

(12) United States Patent
Noelscher

(10) Patent No.: US 7,011,909 B2
(45) Date of Patent: Mar. 14, 2006

(54) PHOTOLITHOGRAPHY MASK AND METHOD OF FABRICATING A PHOTOLITHOGRAPHY MASK

(75) Inventor: Christoph Noelscher, Nürnberg (DE)

(73) Assignee: Infineon Technologies AG, Munich (DE)

( * ) Notice: Subject to any disclaimer, the term of this patent is extended or adjusted under 35 U.S.C. 154(b) by 156 days.

(21) Appl. No.: 10/295,735

(22) Filed: Nov. 15, 2002

(65) Prior Publication Data

US 2003/0091911 A1  May 15, 2003

(30) Foreign Application Priority Data

Nov. 15, 2001  (DE) ................................ 101 56 143

(51) Int. Cl.
  G03F 9/00  (2006.01)
  G03C 5/00  (2006.01)
(52) U.S. Cl. ......................................... 430/5; 430/323
(58) Field of Classification Search ................. 430/5, 430/322, 323, 324
  See application file for complete search history.

(56) References Cited

U.S. PATENT DOCUMENTS 5,300,379 A * 4/1994 Dao et al. ...................... 430/5
5,409,789 A  4/1995 Ito
5,633,103 A * 5/1997 DeMarco et al. ............... 430/5
5,718,829 A * 2/1998 Pierrat .......................... 216/12
5,882,827 A  3/1999 Nakao
2003/0022074 A1  1/2003 Nolscher

FOREIGN PATENT DOCUMENTS

DE  197 09 470 A1  3/1998
DE  101 36 291 A1  2/2003
JP  07 306 522 A  11/1995

* cited by examiner

Primary Examiner—Saleha R. Mohamedulla
(74) Attorney, Agent, or Firm—Laurence A. Greenberg; Werner H. Stemer; Ralph E. Locher

(57) ABSTRACT

A photolithography mask is based on a combination of a half-tone phase mask and an alternating phase mask such that, when the radiation passes through some of the openings, a phase difference is in each case produced between adjacent openings, and the surroundings of the openings are partially transparent and shift the phase of the radiation. Consequently, the advantages of alternating phase masks and half-tone phase masks can be realized on one mask and, accordingly, significantly enlarged process windows for the actual lithography process result with the photolithography mask according to the invention. In particular, these advantages can be obtained with only one absorber material, and the size of non-imaging auxiliary structures is approximately as large as the smallest main structure. In addition, the invention provides methods for fabricating the photolithography masks according to the invention.

30 Claims, 9 Drawing Sheets

PHOTOLITHOGRAPHY MASK AND METHOD OF FABRICATING A PHOTOLITHOGRAPHY MASK

BACKGROUND OF THE INVENTION

Field of the Invention

The present invention relates to masks for photolithographic processes and to methods of fabricating such masks. The present invention relates, in particular, to photolithography masks for the patterning of radiation-sensitive resist layers on semiconductor substrates for the fabrication of large scale integrated semiconductor components, and to methods for fabricating these masks.

In the course of the ever decreasing structure dimensions for the production of large scale integrated semiconductor components, a dimensionally accurate photolithographic transfer of mask structures to radiation-sensitive resist layers is becoming more and more important. In the meantime, semiconductor components are fabricated with structure line widths of 180 nm or less for commercial use in large volumes, so that the requirements made of the patterning process steps must satisfy very high standards. In this case, the photolithographic transfer of mask structures to radiation-sensitive resist layers is one of the outstanding techniques for patterning layers on semiconductor components.

In this case, the photolithographic transfer of mask structures to a radiation-sensitive resist layer is effected in a plurality of steps. The alignment of the mask above the substrate covered with the radiation-sensitive resist layer is followed by the exposure of the radiation-sensitive resist layer through the mask for marking the resist layer material to be removed (or to be left). In this case, the exposure of the radiation-sensitive resist layer can be effected in the silhouette method, the mask bearing on the resist layer (contact exposure) or being applied closely above the resist layer (proximity exposure). For very high resolution patterning, on the other hand, the exposure is carried out by means of a so-called projection exposure. In this case, the light that has passed through the mask is focused in a projection objective onto the resist layer, the projection objective imaging the maximum possible number of higher orders of diffraction produced by the mask structure. This imaging method makes it possible to image a minimum transferable structure line width R of $$R = k \cdot \lambda / NA \qquad (1)$$

from the mask onto the resist layer. In this case, $\lambda$ is the wavelength with which irradiation or exposure is effected, NA is the numerical aperture and k is an empirical constant whose value nowadays is about 0.4. The theoretical limit for a line grating of a period 2R is k=0.25.

If the radiation-sensitive resist layer is a positive resist layer, then the exposure brings about at the exposed locations a chemical alteration of the resist layer material, which can be flushed out from the resist layer during development. By contrast, if the radiation-sensitive resist layer is a negative resist layer, then the non-exposed material is flushed out during development. In order to obtain the same structure as in the case of the positive resist, the mask must be patterned essentially complementarily with respect to the mask for the positive resist.

The exposure is followed by the development of the resist layer by spraying or, for example, pouring on developer liquid which selectively strips away the marked resist layer material. After the drying of the substrate, the patterned resist is finally obtained, which, in conclusion, is generally subjected to a thermal step for curing.

At the end, the minimum structure line width on the mask which is actually produced after the production of the resist structure is greater than the limit resolution calculated from (1) for k=0.25, for a number of reasons. Firstly, the resist layer has a finite thickness, so that the imaging blurs slightly; furthermore, the developer acts isotropically, so that the resist is also removed in the lateral direction during the development of the resist layer. The minimum structure line width on the mask which is required for the production of a resist layer structure on a semiconductor substrate therefore depends on many parameters and is determined individually for each patterning process.

The mask, by way of example, comprises an unpatterned quartz glass substrate which is light-transparent (transmissive) even in the UV region and on which a thin opaque layer, usually made of black chromium, is applied. The black chromium layer produces, together with the transparent regions, the mask structure which is imaged onto the resist layer. In this case, the black chromium layer produces the darkened regions on the resist layer, while the light-transparent region produces the exposed regions on the resist. If the resist is positive, then the resist becomes soft in the exposed regions and is removed by the development step. If the resist is negative, then the resist remains insoluble in the exposed regions, so that the non-exposed regions are removed during development. For a dimensionally accurate structure transfer, it is furthermore important to ensure a homogeneous exposure dose over the region to be exposed.

Various effects can contribute to impairing the dimensional fidelity. Firstly, the finite resist contrast $\gamma$, which is a measure of the resist removal gradient, causes rounding of originally cornered mask structures. Furthermore, interference effects, diffraction effects and scattered light which arise at structure elements of the mask, the resist layer and/or the prepatterned substrate surface, and imaging errors, such as lack of focus and lens aberrations, can result in the effective exposure dose not being homogeneous in the resist layer regions.

FIG. 1 illustrates the abovementioned difficulties on a conventional lithography mask, which has a radiation-transparent substrate 11 made of glass, for example, and a radiation-opaque layer 12 made of chromium, for example. In this case, the openings 13, 14 in the radiation-opaque layer 12 correspond to the structure which is intended to be transferred to the photoresist layer on the wafer in the corresponding mask step. During an exposure, radiation, for example ultraviolet light, passes through the openings 13, 14 in the radiation-opaque layer 12 and, on account of interference effects, results in the illustrated distribution of the electric field E in the photoresist layer on the wafer.

On account of diffraction effects, an undesirable exposure occurs in the photoresist layer between the openings 13 and 14, an actually dark region on the mask. Since the exposure intensity is proportional to the square of the field strength, the field strength distribution shown in FIG. 1 results in a corresponding intensity distribution I in the photoresist layer.

In order to avoid these difficulties and in order to improve the structure resolution, so-called "alternating phase masks" are also increasingly being used, therefore, instead of the previously described so-called "binary masks". In this case, a phase deviation is applied to every second opening 13 in the radiation-opaque layer 12, for example by etching the glass substrate 11, in such a way that a phase difference is obtained between adjacent openings 13, 14. In this case, 180° is generally set as the phase difference. By using this technique it is possible, in the case of highly periodic, grating-like structures, to obtain an increase in the structure resolution by up to a factor of 2 compared with the conventional technique.

FIG. 2 illustrates the resulting situation. On account of the 180° phase difference between adjacent openings 13, 14, destructive interference now occurs between the radiation which passes through the left-hand opening 13 and the radiation which passes through the right-hand opening 14. Therefore, the field distribution E in the photoresist layer now has a zero between the two openings 13, 14, which accordingly also results in a significantly lower intensity I between the two openings 13, 14. The exposure contrast is significantly improved in this way.

Unfortunately, however, this positive effect occurs only for radiation-opaque structures which have an opening with a phase difference on both sides. Since the patterns formed by the openings correspond to the structures which are intended to be imaged or transferred into the photoresist layer, situations can arise, however, wherein openings with only one adjacent opening or fully isolated openings occur. In this case, it can happen that such a half-isolated or fully isolated opening is not imaged completely into the resist layer. Attempts have been made hitherto to ensure a transfer into the photoresist layer by widening the corresponding openings at least under optimum lithographic conditions (optimum focus, nominal exposure). However, the lithographic process window is then so small that the corresponding structures, in the production process, often lead to a failure of the component. Accordingly, this technique is used only in rare cases in practice, which has the consequence that critical structures in the layout must be prohibited, which results, however, in a drastic limitation in the application of alternating phase masks.

A further possibility for increasing the structure resolution compared with conventional binary masks consists in the use of so-called half-tone phase masks ("half-tone phase shift mask", HTPSM). To that end, instead of a radiation-opaque layer, a layer which is radiation-transparent to a certain percentage (e.g. 3% to 40% radiation transmission) is used, which shifts the phase of the radiation passing through it by a predetermined magnitude, and is applied to the glass substrate. Afterward, this so-called "half-tone layer" is correspondingly patterned to produce openings in the layer which are matched to the pattern to be transferred. If the mask is then irradiated, a phase jump (generally 180°) occurs at the edges of the openings, as a result of which the attainable resolution can be increased.

FIG. 3 illustrates the resulting situation. The radiation which passes through the openings 13 is not shifted in its phase and has a relatively high intensity. The radiation which passes through the half-tone layer 15 is shifted by 180° in its phase and simultaneously reduced in its intensity. On account of the 180° phase difference between the openings 13 and regions of the half-tone layer 15, a destructive interference occurs at the edge of the openings 13, as a result of which the electric field has a zero and the irradiation contrast is significantly improved.

Unfortunately, however, in the case of half-tone phase masks, the resolution and the process window are relatively small in the case of very densely packed structures with circular illumination. The imaging of these structures can be improved by inclined illumination, although auxiliary structures are required for the simultaneous imaging of isolated structures, which auxiliary structures require a high outlay in the drawing, fabrication and inspection of the masks.

SUMMARY OF THE INVENTION

It is accordingly an object of the invention to provide a photolithography mask, which overcomes the above-mentioned disadvantages of the heretofore-known devices and methods of this general type and which provides for a photolithography mask that is able, in particular, to transfer both densely packed structures and isolated structures into the photoresist layer with a high resolution and high process window.

With the foregoing and other objects in view there is provided, in accordance with the invention, a photolithography mask, comprising:

at least one radiation-transparent substrate and at least one partially transparent layer for shifting a phase of a radiation; and said at least one partially transparent layer for shifting the phase of the radiation having openings formed therein and said openings are formed such that, when the radiation passes through mutually adjacent openings, a phase difference is in each case produced.

In other words, the invention provides a photolithography mask, in particular for the irradiation of radiation-sensitive resist layers on semiconductor substrates, the mask:

a) has at least one radiation-transparent substrate and at least one partially transparent layer which shifts the phase of the radiation, and b) openings are provided in the layer which shifts the phase of the radiation, the openings being formed such that a phase difference is in each case produced when the radiation passes through (at least 2) adjacent openings.

The photolithography mask according to the invention is based on a combination of a half-tone phase mask and an alternating phase mask such that, when the radiation passes through some of the openings, a phase difference is in each case produced between adjacent openings, and the surroundings of the openings are partially transparent and shift the phase of the radiation. In the context of the present application, two openings are designated as adjacent if substantial interference effects occur in the case of the radiation which passes through the two openings. These are similar to those of a conventional alternating PSM, so that the resolution is doubled compared with a COG mask. Moreover, with the same mask, it is possible (also) to image isolated or half-isolated mask gaps with the half-tone absorber as well; small phase assist structures are not necessary. Consequently, the advantages of alternating phase masks and half-tone phase masks can be realized on one mask and, accordingly, significantly enlarged process windows for the actual lithography process result with the photolithography mask according to the invention. In particular, these advantages can be obtained with just one absorber material.

In accordance with one preferred embodiment of the photolithography mask according to the invention, the size of the openings is matched to the phase of the radiation passing through the openings.

In accordance with a further preferred embodiment of the photolithography mask according to the invention, in the layer which shifts the phase of the radiation, provision is made of main openings, which are formed such that the pattern formed by the main openings is transferred to the resist layer in the event of irradiation, and of auxiliary openings, which are formed such that the pattern formed by the auxiliary openings is not transferred to the resist layer in the event of irradiation, a phase difference being produced when the radiation passes through an auxiliary opening and its adjacent main openings.

This preferred embodiment of the photolithography mask according to the invention provides the use of auxiliary openings in addition to the actual main openings which determine the structure. In this case, the auxiliary openings have a phase deviation matched to the adjacent openings. In a preferred embodiment, the auxiliary openings have a phase deviation of 0°, and the main openings have a phase deviation of 180°. In order still to transfer enough light through these auxiliary openings, the latter have to be wider than the auxiliary openings of a binary mask (e.g. a COG mask), and therefore also have to be fabricated such that they are relatively wide in relation to the main structure. This crucially reduces the requirement made of the mask technique. The auxiliary openings make it possible to obtain a significant improvement in the aerial image contrast primarily outside the image plane and thus to ensure a significantly increased depth of focus.

The use of these auxiliary openings again leads, compared to half-tone phase masks, to a significant enlargement of the process window in particular in the case of isolated or half-isolated structures and also to a reduction of the difference in the line widths with respect to densely packed structures. The main openings often have a rectangular form, the main openings generally being significantly longer than wide. In this case, the auxiliary openings are preferably formed parallel to the actual main openings.

Furthermore, it has been shown that, in the case of the photolithography mask according to the invention, the auxiliary openings can be made significantly larger than in the prior art, in particular than in the case of conventional alternating phase masks with Cr absorber, without the auxiliary openings being transferred into the resist layer. In this case, the mask is realized in particular in such a way that the main structures are assigned the phase 180°, the auxiliary structures are assigned the phase 0° and the light which radiates through the absorber is assigned the phase 180°. On account of the significantly increased size of the auxiliary openings, the mask according to the invention can also be monitored and inspected significantly more easily, this being something that often led to problems in the case of conventional masks. In particular, in the case of the photolithography mask according to the invention, the auxiliary openings can be made just as large as main openings. In this case, it is particularly preferred if no phase difference is produced when the radiation passes through a main opening and when the radiation passes through the layer which shifts the phase of the radiation.

Furthermore, it is preferred if at least one auxiliary opening is provided for a half-isolated main opening. In the context of the present application, a main opening is designated as half-isolated if it has an adjacent main opening only in one direction. In the case of a half-isolated main opening, therefore, at least one auxiliary opening is provided which replaces the "missing" adjacent main opening in the opposite direction.

Furthermore, it is preferred if at least two auxiliary openings are provided for an isolated main opening. In the context of the present application, a main opening is designated as isolated if it has no adjacent main opening. In the case of an isolated main opening, therefore, at least two auxiliary openings are provided which replace the "missing" adjacent main opening.

In accordance with one preferred embodiment, a phase difference of 180° is in each case produced when the radiation passes through adjacent openings. Consequently, it is particularly preferred if a phase difference of 180° is produced when the radiation passes through an auxiliary opening and its adjacent main opening or its adjacent auxiliary opening.

Furthermore, it is preferred if the openings (main openings and/or auxiliary openings) form a grating-like pattern. In this case, it is preferred if the auxiliary openings are arranged at a distance from the adjacent main opening which amounts to approximately the period of the grating.

Furthermore, it is preferable for the radiation-transparent substrate, at least in the region of one of the openings in the partially transparent layer which shifts the phase of the radiation, to have a recess with a first base surface. In this way, it is possible to produce a phase difference of preferably 180° with respect, for example, to an adjacent opening.

Furthermore, it is particularly preferred for at least one opening in the partially transparent layer which shifts the phase of the radiation to lie within the recess in the radiation-transparent substrate. In this context, it is also preferable for the side walls of the recess in the radiation-transparent substrate to be covered by the partially transparent layer which shifts the phase of the radiation. In this case, it is particularly preferable for the opening in the layer which shifts the phase of the radiation which lies within the recess in the radiation-transparent substrate to have a smaller base surface than the first base surface of the recess.

This arrangement of the opening in the layer which shifts the phase of the radiation relative to the recess in the substrate makes it possible to avoid the negative effects caused by scatter at the edges, e.g. intensity loss, which may occur, for example, in a photolithographic process step as a result of the side walls of the recess. The fact that the opening in the layer which shifts the phase of the radiation is produced within the recess in the substrate eliminates these negative effects and thereby improves the imaging characteristic of the masks obtained in this way. This is particularly true if the side walls of the recess in the substrate are covered by the layer which shifts the phase of the radiation and/or if the base surface of the opening in the layer which shifts the phase of the radiation is smaller than the first base surface of the recess.

With the above and other objects in view there is also provided, in accordance with the invention, a method for fabricating a photolithography mask, comprising the following steps:

a) a radiation-transparent substrate, to which at least one partially transparent layer which shifts the phase of the radiation is applied, a protective layer then being applied above the layer which shifts the phase of the radiation, is provided, b) the partially transparent layer which shifts the phase of the radiation and the protective layer are patterned so that at least two openings are formed in the partially transparent layer which shifts the phase of the radiation, c) a resist layer is applied and patterned in such a manner that at least one of the two openings in the partially transparent layer which shifts the phase of the radiation is uncovered, d) the radiation-transparent substrate is etched, the protective layer protecting material of the partially transparent layer which shifts the phase of the radiation from being removed by the etching, e) the resist layer is removed, and f) the protective layer is removed at least in partial regions.

The method according to the invention provides the photolithography masks according to the invention, wherein the advantages of the combination of a half-tone phase mask and an alternating phase mask, which have already been discussed in connection with the masks according to the invention, are realized. In addition, the method according to the invention offers the advantage that the partially transparent layer which shifts the phase of the radiation is completely covered by the protective layer on its substantially vertical surface during the etching of the substrate. As a result, in particular those regions of the partially transparent layer which shifts the phase of the radiation which are situated in the immediate vicinity of the openings in the resist layer are protected, and material cannot be etched away in these regions. It is therefore possible to ensure that the partially transparent layer which shifts the phase of the radiation has a predetermined, defined thickness everywhere.

In a preferred embodiment of the method according to the invention, the two types of openings in the partially transparent layer which shifts the phase of the radiation have a different lateral extent (bias). This makes it possible to achieve a more accurate setting of the intensity of the irradiation which is matched to the phase.

In a particularly preferred variant of the method according to the invention, in step d) the partially transparent layer which shifts the phase of the radiation is subjected to undercut etching. Undercut etching results in the side walls of the recess in the substrate only being exposed to irradiation to a considerably reduced extent, so that the adverse effects of the side walls during irradiation are significantly reduced.

Again with the above and other objects in view there is provided, furthermore, a method which comprises the following steps:

a) a radiation-transparent substrate, on which at least one first recess with a first base surface is provided, is provided, b) a partially transparent layer which shifts the phase of the radiation is applied to the substrate, c) a resist layer is applied to the partially transparent layer which shifts the phase of the radiation and is then patterned, and d) the partially transparent layer which shifts the phase of the radiation is patterned in such a manner that at least two openings are produced in it, at least one of the openings being produced within the recess in the radiation-transparent substrate.

In a particularly preferred variant of this method, in step d) the partially transparent layer which shifts the phase of the radiation is patterned in such a way that the side walls of the recess in the radiation-transparent substrate are covered by the partially transparent layer which shifts the phase of the radiation.

Furthermore, it is preferable that the opening in the partially transparent layer which shifts the phase of the radiation, which opening is produced within the recess in the radiation-transparent substrate, has a base surface which is smaller than the first base surface of the recess in the substrate.

In a further preferred variant of the method according to the invention, before step c) a protective layer is additionally applied to the partially transparent layer which shifts the phase of the radiation. The result of this is that once again there is no disadvantageous removal of material by etching from the partially transparent layer which shifts the phase of the radiation during the etching of the substrate.

In the inventive methods of the present invention, it is particularly preferable for the partially transparent layer which shifts the phase of the radiation at least to include $MoSi_zO_xN_y$. However, it is also possible to use other suitable materials as half-tone layers. Furthermore, it is preferable for the protective layer at least to include Cr and/or $CrO_xN_y$. However, it is also possible for other materials to be used as protective layer. The only condition is that the materials be sufficiently resistant to the substrate etching to prevent the partially transparent layer which shifts the phase of the radiation from remaining substantially unattacked by this etching.

In the methods according to the invention, it is preferable to use a quartz substrate as the radiation-transparent substrate. It would also be possible to use any other material which is suitable for the fabrication of photolithography masks.

Other features which are considered as characteristic for the invention are set forth in the appended claims.

Although the invention is illustrated and described herein as embodied in a photolithography mask, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
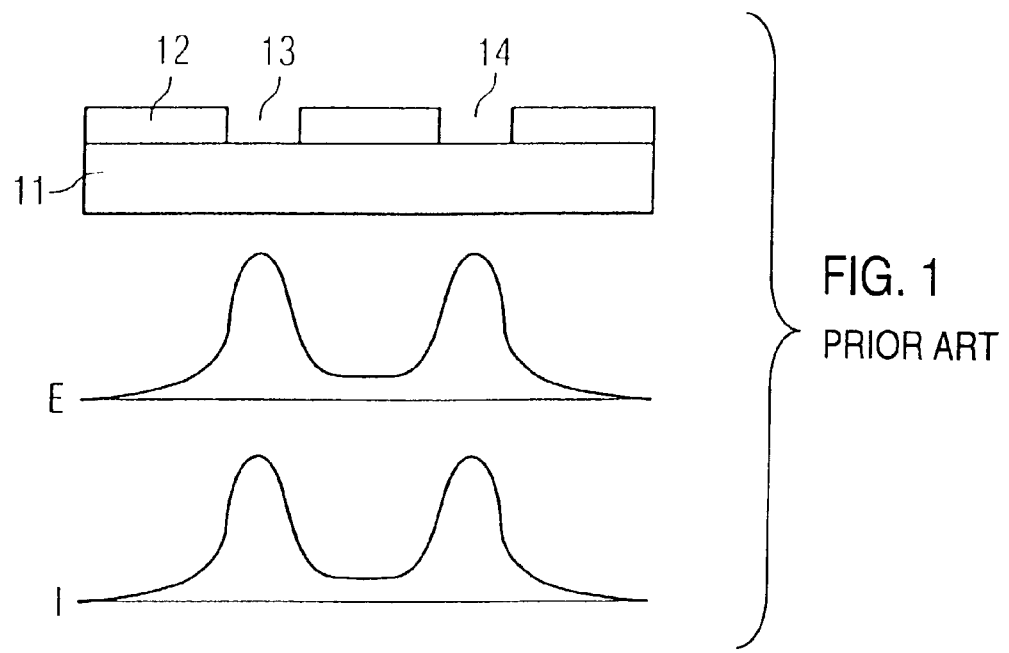
FIG. 1 is a schematic side-view of a photolithography mask according to the prior art and a distribution graph for the associated electrical field and a radiation intensity graph.
Figure 2:
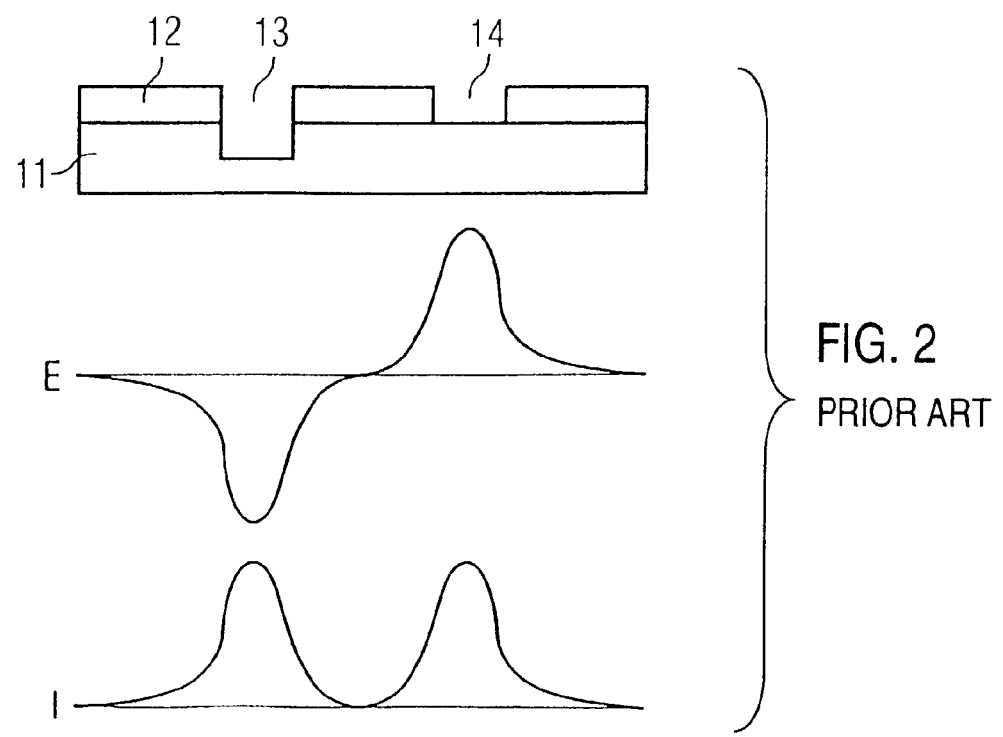
FIG. 2 is a similar set of views referring to a further lithography mask according to the prior art.
Figure 3:
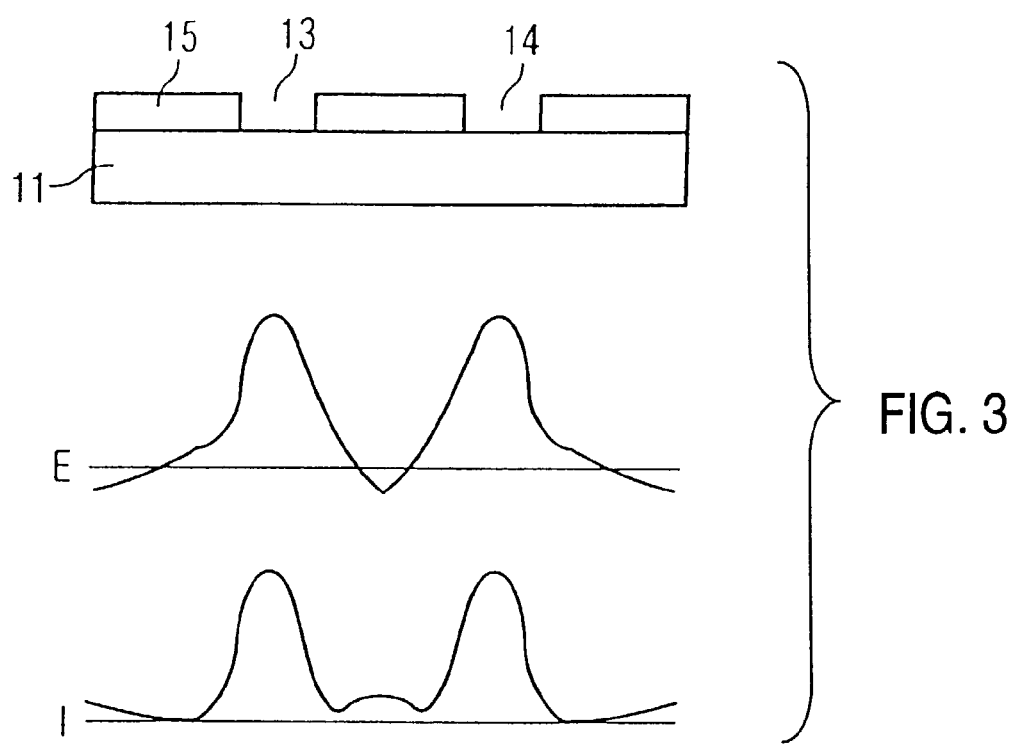
FIG. 3 is a similar set of views referring to again a further lithography mask according to the prior art.
Figure 4:
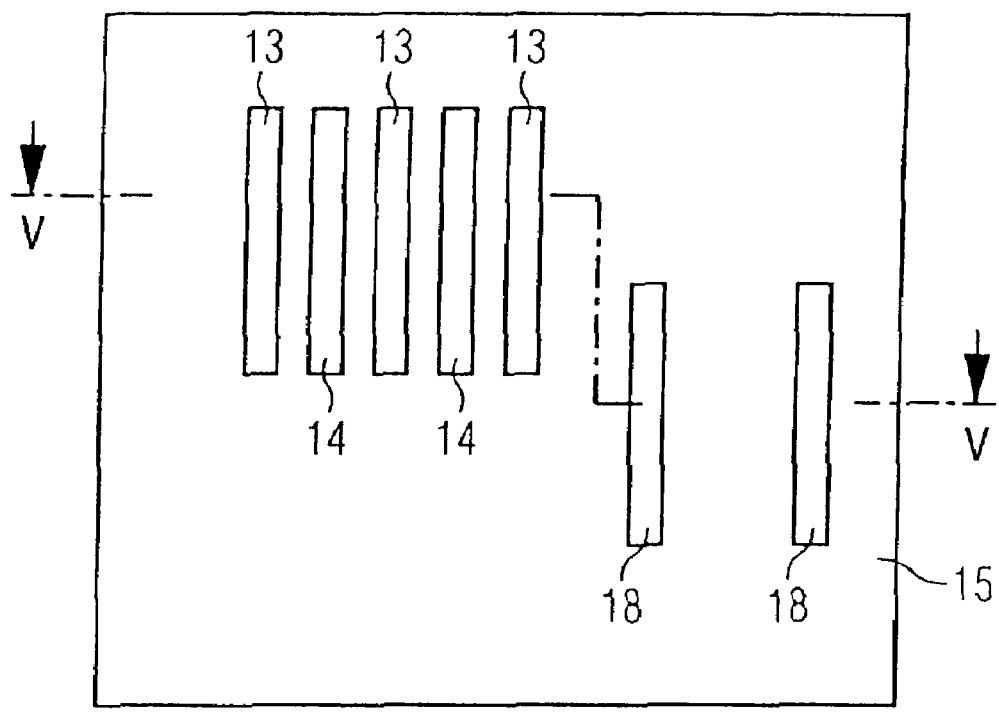
FIG. 4 is a plan view onto a photolithography mask in accordance with one embodiment of the present invention.

Referring now once more to the figures of the drawing in detail, and particularly to FIG. 4 thereof, there is shown a diagrammatic plan view of a photolithography mask in accordance with a first embodiment of the present invention. The embodiment shown in FIG. 4 has a radiation-transparent substrate 11, for example made of glass, and a half-tone layer 15 which is radiation-transparent to a certain percentage and is applied to the substrate 11 and shifts the phase of the radiation that passes through it by a predetermined magnitude. By way of example, $MoSi_2O_xN_y$ can be used as the material for the half-tone layer 15.

Figure 5:
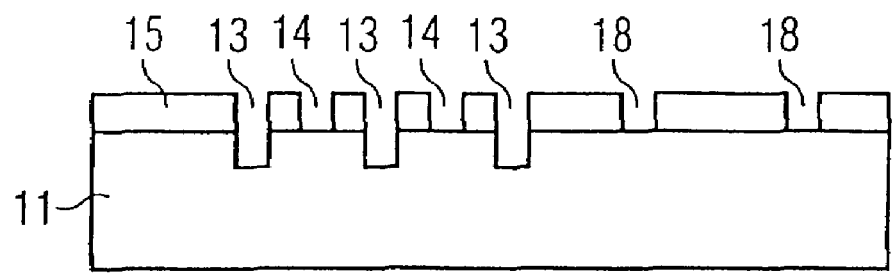
FIG. 5 is a diagrammatic sectional view taken along the line V—V in FIG. 4.

The mask has a group of 5 main openings 13 and 14, which are arranged regularly and relatively close together, and largely isolated main openings 18. In this case, the main openings are each provided as openings in the half-tone layer 15. Furthermore, the main openings 13 and 14 are formed such that a phase difference is in each case produced when the radiation passes through adjacent main openings 13, 14. In the present embodiment, this phase difference, preferably 180°, is produced by a corresponding recess of the substrate 11 in the region of the openings 13 (see FIG. 5).

The mask according to the invention thus has the advantages of a half-tone phase mask for the isolated and the not particularly densely packed main openings 18 and the advantages of an alternating phase mask for the densely packed main openings 13, 14. In this case, the mask according to the invention is formed such that there is no chromium present in the imaging region, i.e. all the absorbing regions of the mask comprise half-tone material, as a result of which the mask fabrication and inspection is simplified to a significant extent. That does not rule out the case where Cr is still present in some regions of the mask, e.g. in the scribe line or at the outer edge thereof.

Figure 6:
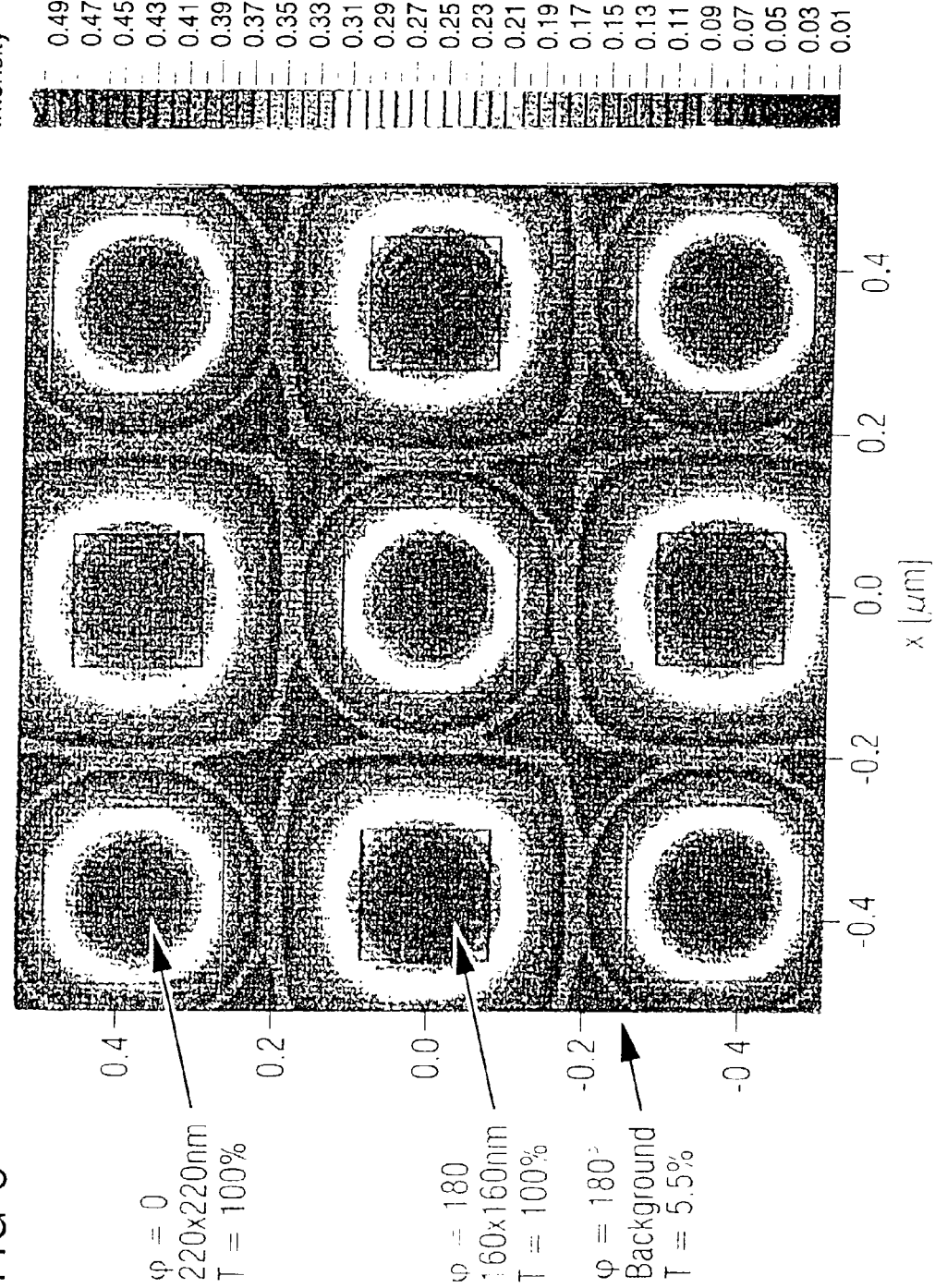
FIG. 6 is a detailed plan view of a photolithography mask in accordance with a further embodiment of the present invention.

FIG. 6 shows a detail from a photolithography mask in accordance with a further embodiment of the present invention. The mask serves for producing contact holes having a diameter of 180 nm and a center-to-center distance ("pitch") of 360 nm (in each case relative to the wafer). At the same time, FIG. 6 shows a corresponding intensity distribution for an exposure with $\lambda=248$ nm, NA=0.68 and $\sigma=0.5$ ($\sigma$ is a measure of incoherence of the exposure). In this case, the main openings 14 have a size of 220×220 nm, a phase of 0° and a transmission of 100%. The main openings 13 have a size of 160×160 nm, a phase of 180° and a transmission of 100%. The remaining regions (half-tone material 15) have a phase of 180° and a transmission of 5.5%.

During the exposure, there results for the main opening 13 a dose leeway of about 10% in conjunction with a focus leeway of about 0.5 $\mu$m. A dose leeway of about 23% results for the main opening 13. Compared with a pure half-tone phase mask, the mask according to the invention results in more than a doubling of the process window for the actual lithography process.

Figure 7:
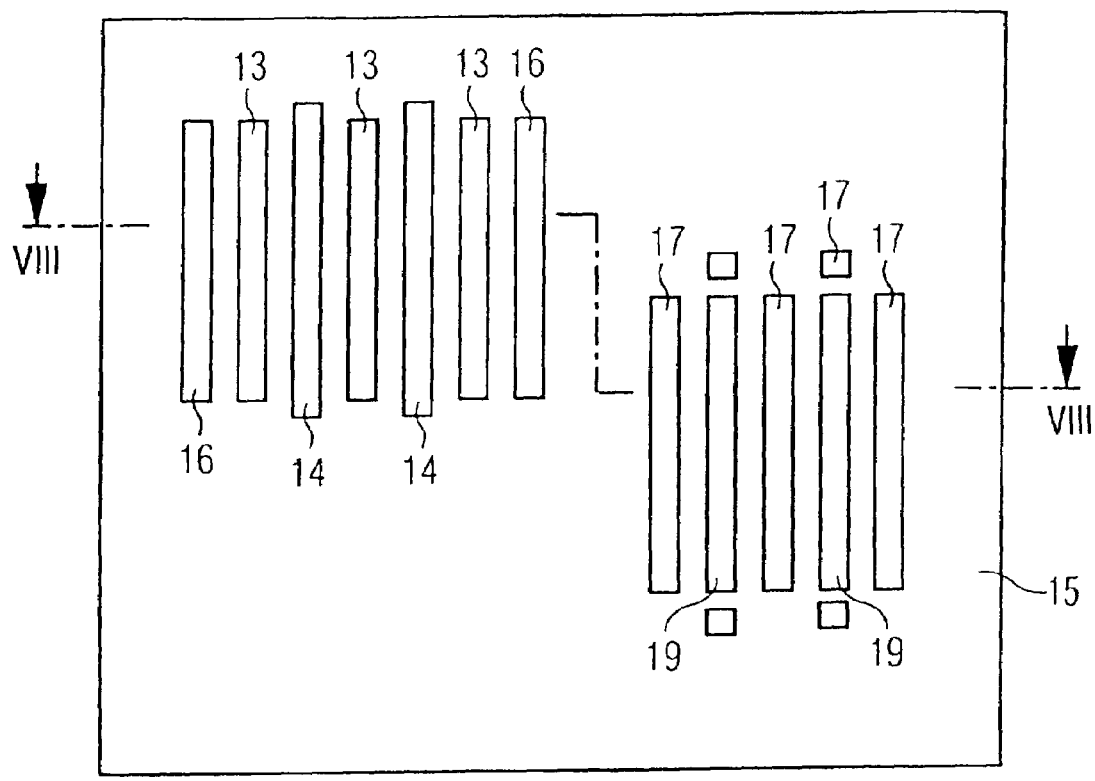
FIG. 7 is a plan view onto a photolithography mask in accordance with a further embodiment of the present invention.

FIG. 7 shows a photolithography mask in accordance with a further embodiment of the present invention. The embodiment shown in FIG. 7 again has a radiation-transparent substrate 11, for example made of glass, and a layer 15 which is radiation-transparent to a certain percentage and is applied to the substrate 11 and shifts the phase of the radiation that passes through it by 180°. The mask again has a group of 5 main openings 13 and 14, which are arranged regularly and relatively close together, and largely isolated main openings 19. Furthermore, the main openings 13 and 14 are formed such that a phase difference of 180° is in each case produced when the radiation passes through adjacent main openings 13, 14.

An auxiliary opening 16 is in each case arranged parallel to the outer main openings 13, the phase deviation differing from the adjacent main openings by 180°. The auxiliary openings 16 have the effect that the half-isolated outer main openings 14 are imaged with a significantly higher aerial image contrast and the exposure method has a significantly improved lithographic process window. Despite the fact that the auxiliary openings 16 may be approximately the same size as the main openings 13, 14, the auxiliary openings 16 are not transferred into the resist layer.

Figure 8:
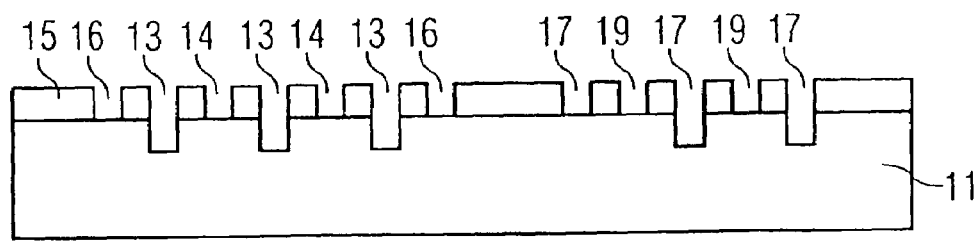
FIG. 8 is a diagrammatic sectional view taken along the line VIII—VIII in FIG. 7.

By contrast, the isolated main openings 19 are assisted by auxiliary openings 17 on all sides. The auxiliary openings 17, oriented parallel to the main openings 19, are likewise approximately the same size as the main openings 19. Despite their size, however, they are not transferred into the resist layer. In this case, the phase relationships in the surroundings of the isolated main openings 19 are chosen such that no phase difference is produced when the radiation passes through a main opening 19 and when the radiation passes through the half-tone layer 15. By contrast, a phase difference of 180° occurs when the radiation passes through a main opening 19 and when the radiation passes through the corresponding auxiliary openings 17. This is achieved, for example, once again by corresponding recesses in the glass substrate in the region of the auxiliary openings 17 (see FIG. 8).

The use of these auxiliary openings again leads to a significant enlargement of the process window in particular in the case of isolated or half-isolated structures and also a reduction of the difference in the line widths with respect to densely packed structures. Furthermore, by virtue of the auxiliary openings, the main openings can be imaged with good quality over a significantly larger region of defocusing. This is important in particular when a completely planar surface is not present on the substrate and, consequently, it is not possible to focus simultaneously onto all the regions of the surface. On account of the significantly increased size of the auxiliary openings, the mask according to the invention can also be monitored and inspected significantly more easily, this being something which often led to problems in the case of conventional masks. In particular, the auxiliary openings can be made approximately just as large as the main openings in the case of the photolithography mask according to the invention.

Figure 9:
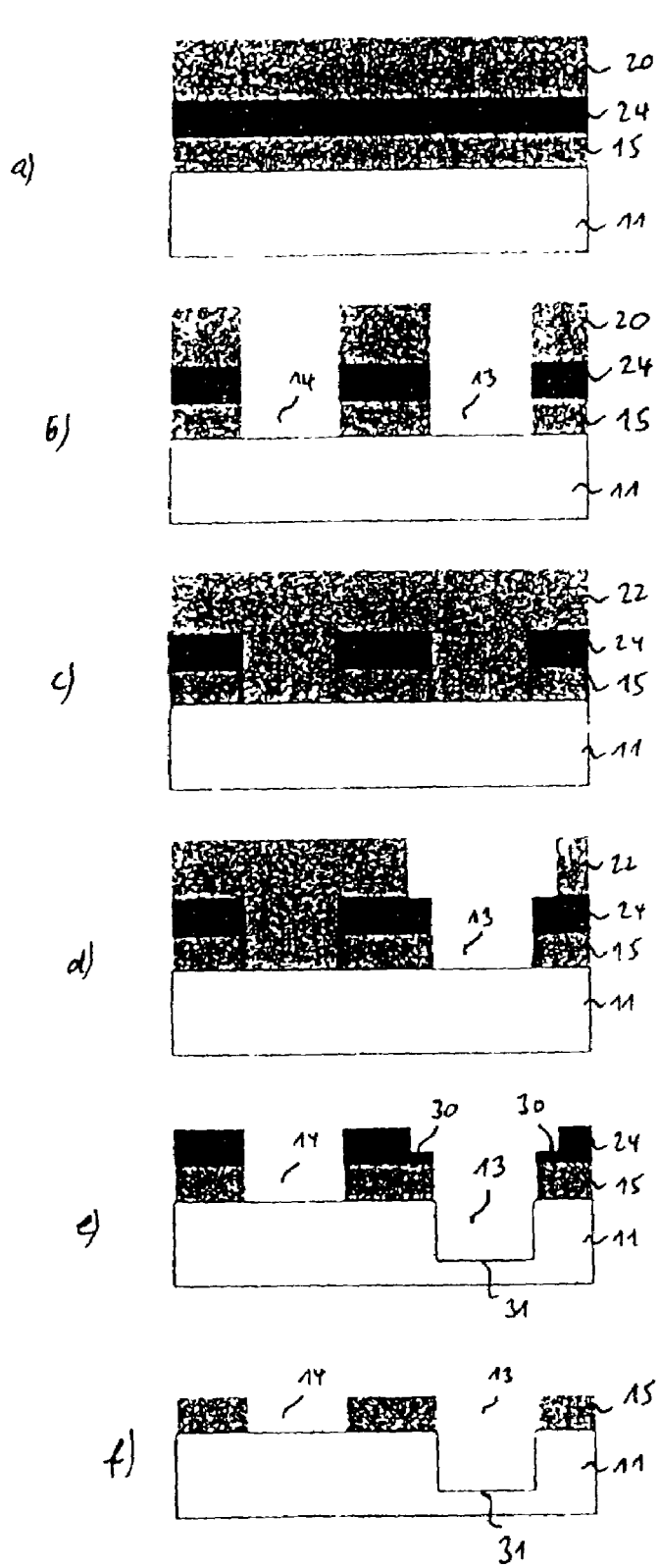
FIG. 9 shows, in side-elevational section, a sequence of steps of a first embodiment of a method according to the invention.

FIG. 9 diagrammatically depicts an embodiment of a method according to the invention. FIG. 9a shows a quartz substrate 11, to which a half-tone layer 15 comprising $MoSi_zO_xN_y$ has been applied as a layer which shifts the phase of the radiation. A protective layer 24 comprising $Cr/CrO_xN_y$ has been applied on top of the half-tone layer 15, and a resist layer 20 has in turn been applied to the protective layer 24.

Conventional layer deposition processes, such as for example CVD processes, evaporation coating, cathode sputtering or, in particular for the resist layer, spin-coating processes, can be used to apply the various layers. The resist layer 20, the protective layer 24 and the half-tone layer 15 are then patterned by means of conventional methods. This results in the openings 13 and 14 being produced in the half-tone layer 15. By way of example, the resist layer 20 can be patterned by means of an electron beam writing unit. The patterning of the protective layer 24 and of the half-tone layer 15 may take place by means of wet-chemical etching processes or by means of dry etching processes, such as for example conventional physical-chemical plasma etching processes. Examples of these processes include reactive ion etching, reactive ion beam etching, anodically coupled plasma etching in the parallel plate reactor, magnetic field-enhanced reactive ion etching, triode reactive ion etching or inductively coupled plasma etching.

Then, as illustrated in FIG. 9c, a further resist layer 22 is deposited and is patterned, for example, by means of an electron beam. During this patterning, wherein the substrate etching is prepared for, not only is the opening 13 in the half-tone layer 15 completely uncovered, but, in addition, a region of the protective layer 24 which directly adjoins the opening 13 is also uncovered. This is because the resist cannot be patterned with such accuracy that the opening in the resist is produced congruently with the opening in the half-tone layer 15.

Then, as illustrated in FIG. 9e, the substrate is etched, with the result that a recess with a first base surface 31 is produced in the substrate. Conventional etching processes, such as for example the wet and dry etching processes which have already been mentioned above, can also be used for this purpose. Then, the resist layer 22 is removed.

In this step, the protective layer 24 acts as a protective hard mask which prevents undesired removal of material from the half-tone layer 15 by etching. If the protective layer 24 were not present, the half-tone layer 15 would be attacked by the substrate etching in the immediate vicinity of opening 13 and would therefore have an irregular layer profile. This would cause the phase change at the boundary between the recess in the substrate and the half-tone layer 15 to become blurred and inaccurate, with the result that in turn the imaging characteristic of the finished mask would be impaired. The use of the protective layer 24 means that only this protective layer 24 is subject to removal of material during the substrate etching, resulting in the formation of the abraded regions 31 in the protective layer 24.

FIG. 9f illustrates the finished photolithography mask, from which the protective layer 24 has been completely removed. This can be achieved, for example, by means of a wet-chemical acid etching process. Instead of completely removing the protective layer, in the methods according to the invention it is also possible for the protective layer 24 to be removed only in partial regions. By way of example, the protective layer 24, which is opaque, may be retained in the outer regions of the mask if these are not to be imaged. Alternatively, the protective layer 24 may be retained in the inner region of the mask in order to locally reduce the illumination intensity. For this purpose, after the resist layer 22 has been removed, a further resist layer can be applied and patterned, serving as a mask during the subsequent removal of the protective layer 24. Then, this additional resist layer is removed. A variant of this type is described in connection with the inventive method illustrated in FIG. 12.

Figure 10:
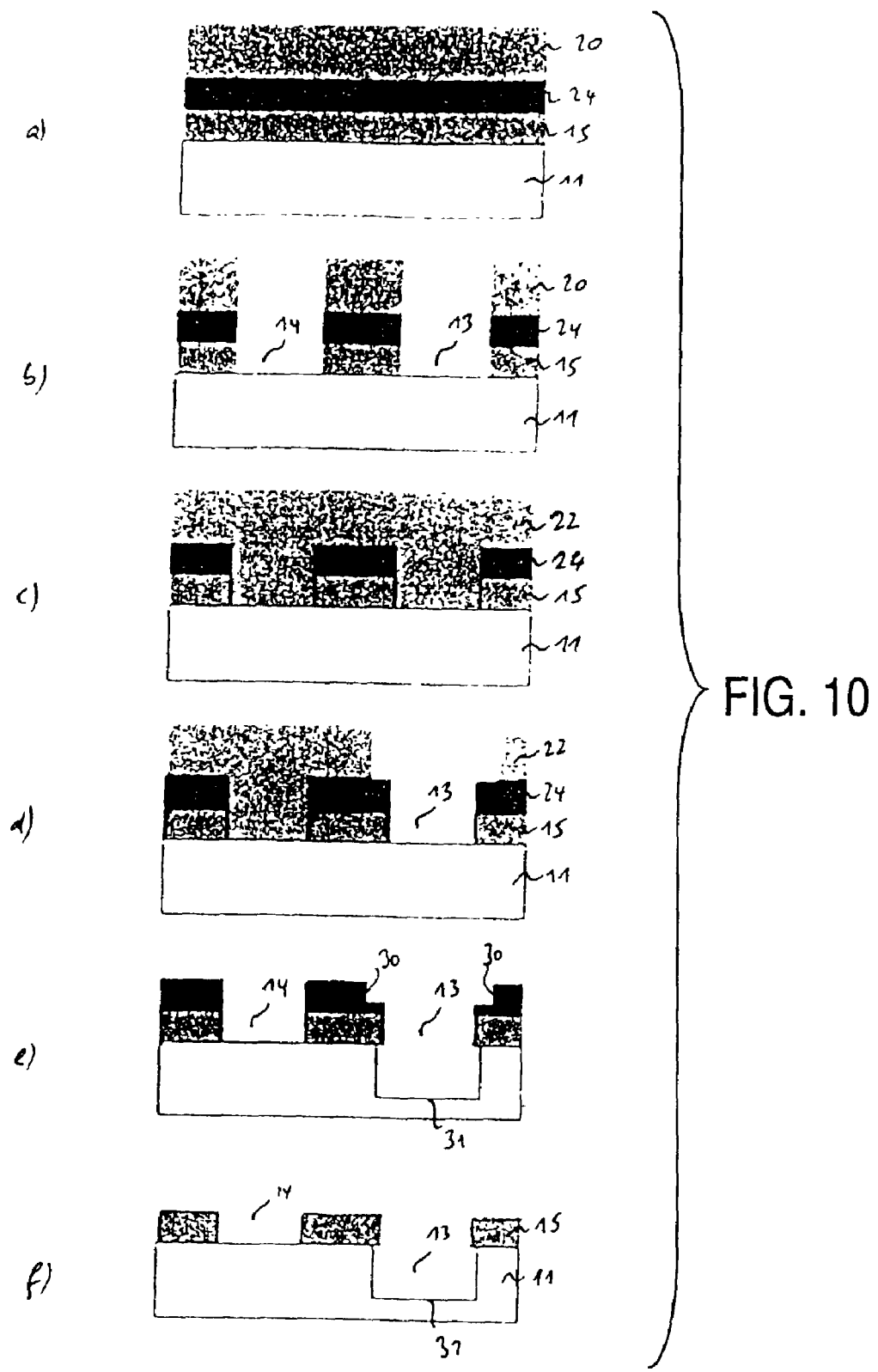
FIG. 10 illustrates a further embodiment of the method according to the invention.

The method according to the invention which is illustrated in FIG. 10 differs from the method illustrated in FIG. 9 only in that during the substrate etching in FIG. 10e a combination of an anisotropic and isotropic substrate etch is used, in order in this way to achieve undercut etching of the opening 13.

Figure 11:
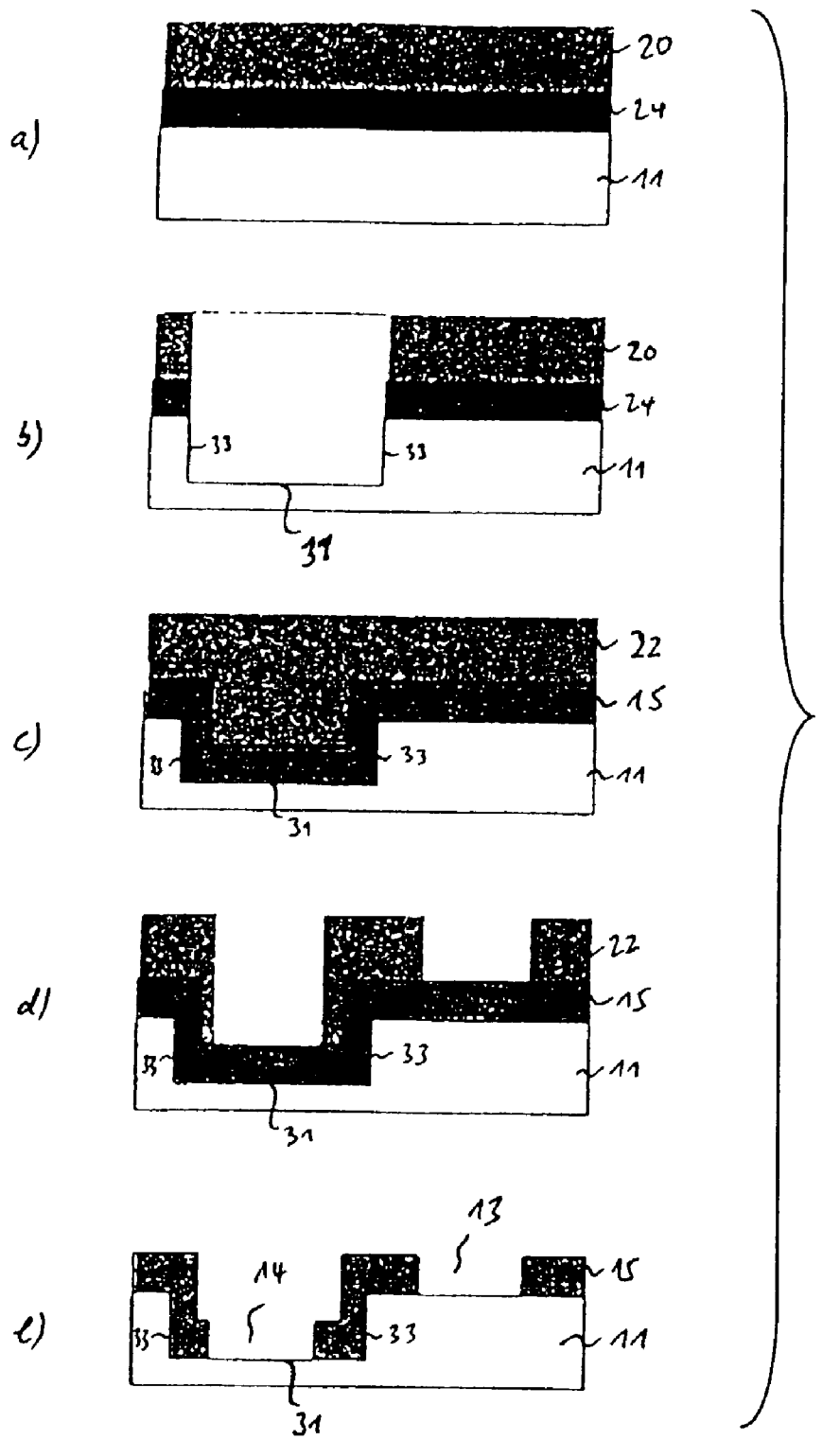
FIG. 11 illustrates yet a further embodiment of the method according to the invention.

FIG. 11 diagrammatically depicts an embodiment of a further method according to the invention. In this method, as illustrated in FIG. 11a, a quartz substrate 11 is provided, and a protective layer 24 and a resist layer 20 are deposited on it by means of conventional methods. The protective layer is once again a Cr/CrO$_x$ layer. Then, the resist layer 20 and the protective layer 24 are patterned and a recess having a first base surface is produced in the substrate 11 by means of an etch (FIG. 11b). After the resist layer 20 and the protective layer 24 have been removed, the half-tone layer 15 is deposited, followed by the resist layer (22), and the latter is patterned by means of conventional photolithographic processes (FIGS. 11c and 11d).

A subsequent etch produces the openings 13 and 14 in the half-tone layer 15, the opening 14 being formed in the recess which has previously been structured in the substrate. The dimensions and position of the opening 14 relative to the recess are selected in such a way that the side walls 33 of the recess and a part of the base surface 31 of the recess are covered by the half-tone layer 15. Then, the resist layer 22 is removed and the finished mask is obtained.

Figure 12:
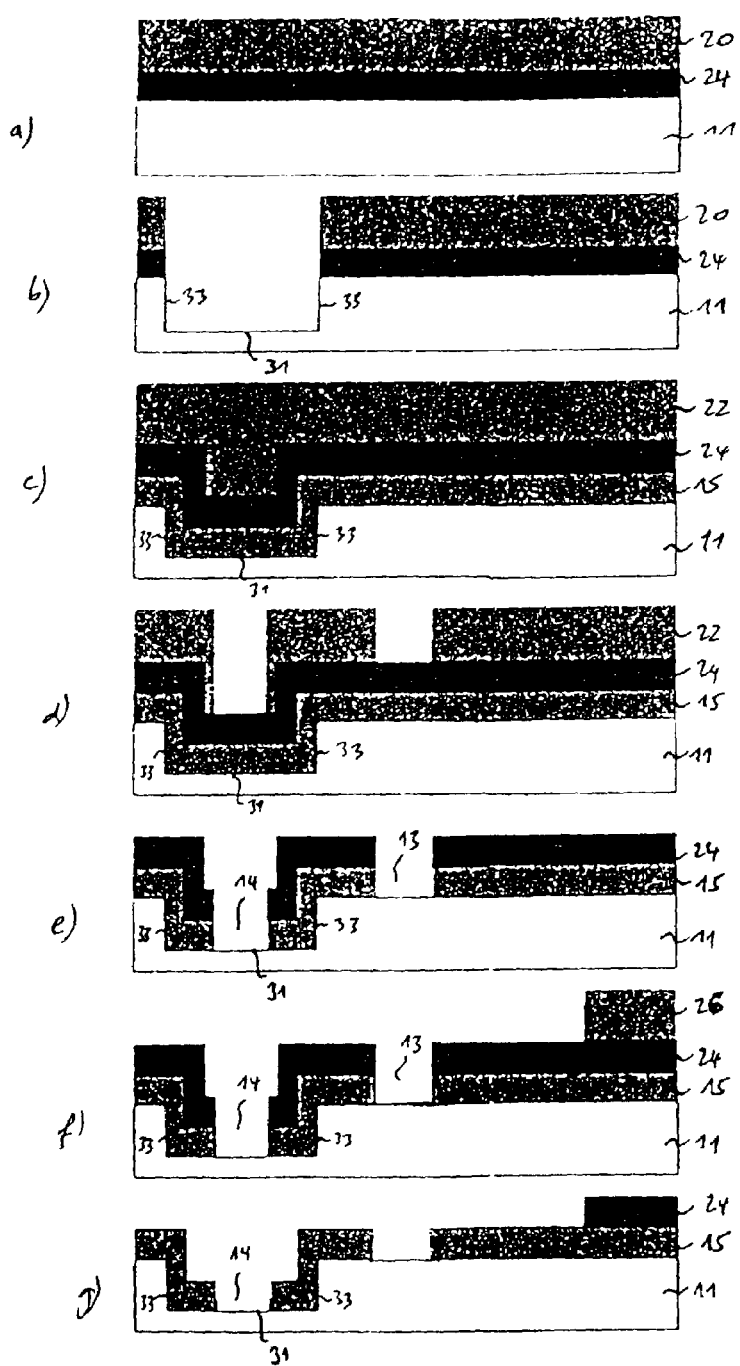
FIG. 12 illustrates again a further embodiment of the method according to the invention.

A further variant of the method according to the invention is illustrated in FIG. 12. The first two steps (FIGS. 12a and 12b) of the method correspond to the steps which have already been described in connection with FIGS. 11a and 11b. Then, as illustrated in FIG. 12c, first of all a half-tone layer, then a protective layer 24 and then a resist layer 22 are deposited on the prepatterned quartz substrate 11. The half-tone layer used may once again be an MoSi$_x$O$_y$N$_z$ layer, and the protective layer used may once again be a Cr/CrO N$_y$ layer. The resist layer used may once again be conventional photoresist layers.

The resist layer 22 is patterned by means of conventional photolithographic processes (FIG. 12d). Then, the protective layer 24 and the half-tone layer 15 are etched, with the result that the openings 13 and 14 are formed in the half-tone layer 15 (FIG. 12e). Then, the resist layer 22 is removed and a further resist layer 26 is deposited and patterned, in order in this way to produce a mask for the patterning of the protective layer 24 (FIG. 12f), since in the present method protective layer 24 is only to be removed in partial regions of the mask.

Then, the protective layer 24 is removed in the uncovered regions. Once again, a wet-chemical acid etch can be used for this purpose. Finally, the resist layer 26 is removed, resulting in the finished mask illustrated in FIG. 12g. The opening 14 in the half-tone layer 15 is once again arranged in the recess produced by the substrate etching, in such a manner that both the side walls 33 and part of the base surface 31 are covered. In this way, the imaging characteristic of the mask is improved, as has already been described. In addition, the use of the protective layer 24 protects the half-tone layer 15 during the patterning of the protective layer 24 and of the half-tone layer 15, so that the openings 13 and 14 are formed with a higher degree of accuracy in the half-tone layer 15, which likewise leads to a more precise phase change at the openings 13 and 14.

I claim:

1. A photolithography mask, comprising:
   at least one radiation-transparent substrate and at least one partially transparent layer for shifting a phase of a radiation; and
   said at least one partially transparent layer for shifting the phase of the radiation having openings formed therein and said openings are formed such that, when the radiation passes through mutually adjacent openings, a phase difference is in each case produced.

2. The photolithography mask according to claim 1, wherein said openings have a size matched to the phase of the radiation passing through the openings.

3. The photolithography mask according to claim 1, in combination with a radiation-sensitive resist layer underneath said transparent substrate, wherein said openings formed in said partially transparent layer include:
   main openings formed to define a pattern that, upon imaging, is transferred to the resist layer; and
   auxiliary openings formed to define a pattern that, upon irradiation, is not transferred to the resist layer;
   wherein a phase difference is produced when the radiation passes through a respective said auxiliary opening and an adjacent said main opening.

4. The photolithography mask according to claim 3, wherein said main openings and said partially transparent layer are configured not to effect a phase difference when the radiation passes therethrough.

5. The photolithography mask according to claim 3, wherein said auxiliary openings are configured to effect a phase shift of 0° when the radiation passes therethrough, and said partially transparent layer is configured to effect a phase shift of 180° when the radiation passes therethrough.

6. The photolithography mask according to claim 3, wherein said main openings include a half-isolated main opening, and at least one auxiliary opening is provided for a half-isolated main opening.

7. The photolithography mask according to claim 3, wherein said main openings include an isolated main opening, and at least two auxiliary openings are provided for an isolated main opening.

8. The photolithography mask according to claim 1, wherein said openings are configured to effect a phase difference of 180° on radiation passing through mutually adjacent openings.

9. The photolithography mask according to claim 1, wherein at least some of said openings are disposed to form a grating pattern with at least one of a grating pattern of main openings and a grating pattern of auxiliary openings.

10. The photolithography mask according to claim 9, wherein said grating pattern has a giving period and said auxiliary openings are arranged at a distance from adjacent said main openings or an auxiliary opening amounting substantially to the period of the grating.

11. The photolithography mask according to claim 1, wherein said partially transparent layer has a radiation transmission of 3% to 40%.

12. The photolithography mask according to claim 11, wherein said partially transparent layer has a radiation transmission of 3% to 10%.

13. The photolithography mask according to claim 1, wherein said radiation-transparent substrate has a recess formed therein with a first base surface formed in a region of at least one of said openings.

14. The photolithography mask according to claim 13, wherein at least one of said openings lies within said recess in said radiation-transparent substrate.

15. The photolithography mask according to claim 14, wherein said recess in said radiation-transparent substrate is formed with sidewalls and said sidewalls are shadowed by said partially transparent layer.

16. The photolithography mask according to claim 13, wherein a respective said opening in said partially transparent layer lying within said recess in said radiation-transparent substrate has a smaller base surface than said first base surface of said recess.

17. An intermediate product assembly in a semiconductor fabrication process, comprising:
a semiconductor substrate;
a radiation-sensitive resist layer formed on said semiconductor substrate; and
a photolithography mask according to claim 1 disposed on said radiation-sensitive resist layer.

18. A method of fabricating a photolithography mask, which comprises the following steps:
providing a radiation-transparent substrate with at least one partially transparent layer for shifting a phase of a radiation, and a protective layer on said partially transparent, phase shifting layer;
patterning the partially transparent, phase shifting layer and the protective layer to form at least two openings in the partially transparent, phase shifting layer;
applying a resist layer and patterning the resist layer to uncover at least one of the openings in the partially transparent, phase shifting layer;
etching the radiation-transparent substrate, while protecting material of the partially transparent, phase shifting layer against etching removal with the protective layer protecting material;
removing the resist layer; and
removing the protective layer at least in partial regions.

19. The method according to claim 18, which comprises forming the openings in the partially transparent, phase shifting layer with a correction in a lateral extent.

20. The method according to claim 18, wherein the etching step includes undercut-etching the partially transparent, phase shifting layer.

21. The method according to claim 18, which comprises forming the phase shifting layer with $MoSi_zO_xN_y$.

22. The method according to claim 18, which comprises forming the protective layer with $Cr/CrO_xN_y$.

23. The method according to claim 18, wherein the radiation-transparent substrate is a quartz substrate.

24. A method of fabricating a photolithography mask, which comprises the following steps:
providing a radiation-transparent substrate structured with at least one first recess having a first base surface;
applying a partially transparent, phase shifting layer to the substrate;
forming a resist layer on the partially transparent, phase shifting layer and patterning the resist layer;
patterning the partially transparent, phase shifting layer to form at least two openings therein, with at least one of the openings being produced within the recess in the radiation-transparent substrate.

25. The method according to claim 24, which comprises, prior to forming the resist layer, additionally applying a protective layer to the partially transparent, phase shifting layer.

26. The method according to claim 24, wherein the patterning step comprises covering the side walls of the recess in the radiation-transparent substrate with the partially transparent, phase shifting layer.

27. The method according to claim 24, which comprises forming the opening in the partially transparent, phase shifting layer, the opening being produced within the recess in the radiation-transparent substrate, with a base surface that is smaller than the first base surface of the recess.

28. The method according to claim 24, which comprises forming the phase shifting layer with $MoSi_zO_xN_y$.

29. The method according to claim 24, which comprises forming the protective layer with $Cr/CrO_xN_y$.

30. The method according to claim 24, wherein the radiation-transparent substrate is a quartz substrate.

* * * * *